United States Patent
Chang et al.

(10) Patent No.: US 7,129,184 B2
(45) Date of Patent: Oct. 31, 2006

(54) METHOD OF DEPOSITING AN EPITAXIAL LAYER OF SIGE SUBSEQUENT TO A PLASMA ETCH

(75) Inventors: Chih-Chien Chang, Miow-Li County (TW); Shun Wu Lin, Taichung (TW); Pang-Yen Tsai, Jhu-bei (TW); Tze-Liang Lee, Hsinchu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 11/001,384

(22) Filed: Dec. 1, 2004

(65) Prior Publication Data

US 2006/0113282 A1 Jun. 1, 2006

(51) Int. Cl.
*H01L 21/302* (2006.01)
(52) U.S. Cl. .......... 438/750; 438/752; 438/756
(58) Field of Classification Search ............ 438/752, 438/756, 750
See application file for complete search history.

(56) References Cited

U.S. PATENT DOCUMENTS

| | | | |
|---|---|---|---|
| 2002/0146888 A1* | 10/2002 | Ryu et al. ............... | 438/300 |
| 2003/0136985 A1* | 7/2003 | Murthy et al. ........... | 257/288 |
| 2004/0045580 A1* | 3/2004 | Kurita et al. ............ | 134/3 |
| 2004/0108575 A1* | 6/2004 | Ohmi et al. ............. | 257/627 |
| 2005/0145944 A1* | 7/2005 | Murthy et al. ........... | 257/351 |
| 2005/0176205 A1* | 8/2005 | Chien et al. ............. | 438/299 |

OTHER PUBLICATIONS

Bae, J., et al., "Excimer Laser-Assisted In Situ Phosphorus Doped $Si_{(1-x)}Ge_x$ Epilayer Activation," ETRI Journal, vol. 25, No. 4, Aug. 2003, pp. 247-252.
Bachman, M., "RCA-1 Silicon Wafer Cleaning," INRF application note, UCI Integrated Nanosystems Research Facility, Fall 1999, pp. 1-3.
Ge, C.-H., et al., "Process-Strained Si (PSS) CMOS Technology Featuring 3D Strain Engineering," IEEE 2003, pp. 1-4.
Kunii, Y., et al., "Vertical SiGe Epitaxial Growth System," Hitachi Review, vol. 51, No. 4, 2002, pp. 104-108.
Rosenblad, C., "LEPECVD- Breaking all records in," Chip, Semiconductor Industry Sourcebook, pp. 24-27.

* cited by examiner

*Primary Examiner*—Nadine Norton
*Assistant Examiner*—Binh X. Tran
(74) *Attorney, Agent, or Firm*—Slater & Matsil, L.L.P.

(57) ABSTRACT

A method of preparing a silicon layer or substrate surface for growing an epitaxial layer of SiGe thereon. The process comprises removing native oxide from the surface of the silicon with an HF solution, and then oxidizing the exposed silicon surface to form a chemically formed layer of silicon oxide of the process damaged silicon surface. The chemically formed layer of silicon oxide is then removed by a second HF cleaning process so as to leave a smooth silicon surface suitable for growing a SiGe layer.

20 Claims, 3 Drawing Sheets

METHOD OF DEPOSITING AN EPITAXIAL LAYER OF SIGE SUBSEQUENT TO A PLASMA ETCH

TECHNICAL FIELD

The present invention relates to the process of depositing an epitaxial layer of SiGe on a silicon layer or substrate and more particularly to depositing such an epitaxial layer of SiGe over a silicon surface that has been damaged by a semiconductor fabrication process, for example, a plasma etching process.

BACKGROUND

The ever-increasing demand of new electronic systems such as telecommunication devices continues to place greater and greater demands on semiconductor devices. Consequently, the electronic industry has discovered that SiGe (silicon germanium) HBT (hetero-junction bipolar-transistors) can provide high-speed operation, low noise and low power consumption devices. In addition, SiGe can also be used with strained-Si channels, which, as will be appreciated by those skilled in the art, facilitates the excellent performance of CMOS type LSI circuits. Unfortunately, the industry has encountered significant problems in the deposition of epitaxial layers of SiGe over a silicon substrate or wafer surface. This is especially true where the Si substrate is subjected to other harsh semiconductor processes prior to the attempt to deposit an epitaxial layer of SiGe. Therefore, it would be advantageous if the successful growth or deposition of an epitaxial layer of SiGe on the surface of a silicon wafer previously subjected to various semiconductor processes could be achieved.

SUMMARY OF THE INVENTION

The present invention provides a method of preparing the surface of a silicon layer so that a layer of silicon germanium can be effectively epitaxially grown over the silicon layer. The method of the invention is especially useful for repairing such a silicon layer that has been damaged by various semiconductor processes such as for example plasma etching. The method comprises subjecting the substrate or silicon layer to a first cleaning process comprising a solution of HF (hydrogen fluoride) for a minimum time period of about 10 seconds to remove natural or native silicon oxide from the top of the damaged surface. Although various volume ratio solutions of HF (hydrogen fluoride) to $H_2O$ (water) may be used, a volume ratio of HF to water on the order of about 1:50 has been found to be especially suitable. A layer of the exposed damaged silicon surface is then oxidized to form a layer of silicon oxide by a suitable process such as the RCA standard clean-1 (SC-1) process developed by Werner Kern of RCA in the late 1960's. The SC-1 process is a solution comprised of between about 1%–30% of ammonia hydroxide ($NH_4OH$), 8%–35% of hydrogen peroxide ($H_2O_2$), and between about 40% to 90% of deionized water. A particularly effective volume ratio solution for oxidizing a damaged layer of silicon is about $NH_4OH: H_2O_2: H_2O=1:8:60$ (1.45% $NH_4OH$, 11.59% $H_2O_2$, and 89.6% deionized water). In addition to using the SC-1 cleaning process to oxidize the exposed damaged silicon surface, the substrate or silicon layer may be subjected to an ozone ($O_3$) environment as an alternate method of oxidizing the silicon surface.

After the damaged silicon surface is oxidized to form a layer of silicon oxide, the layer of silicon oxide is then removed by a second cleaning process comprising a second solution of HF having a volume ratio similar to that of the first cleaning process for a period of about 30seconds. This second cleaning provides a smooth silicon surface suitable for depositing an epitaxial layer of SiGe.

Tests have indicated that an epitaxial layer of SiGe can be deposited on a silicon substrate having either a <100> crystalline orientation or a <110> crystalline orientation.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
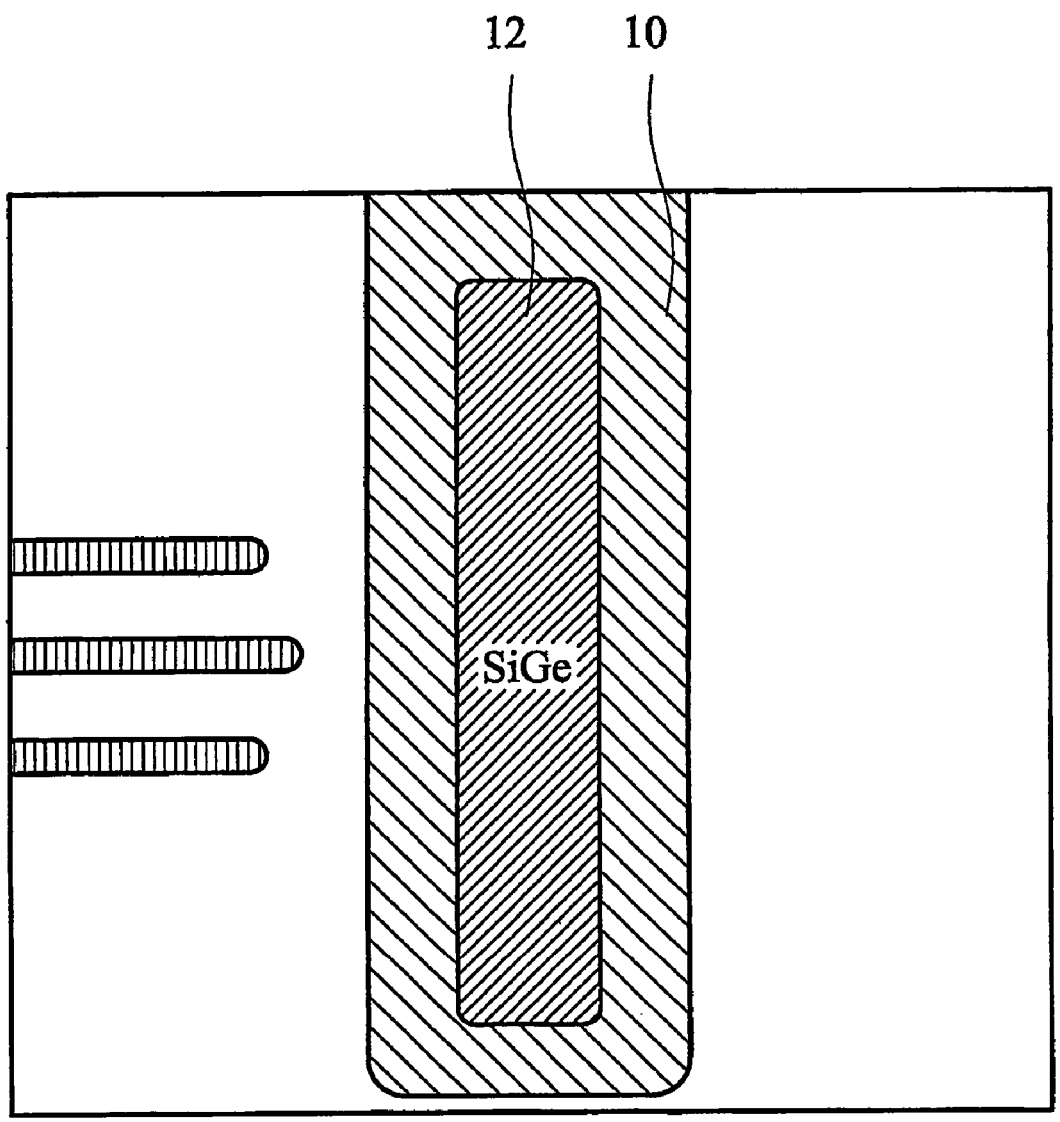
FIG. 1 is an illustration of an actual microphotograph of results of an attempt to grow an epitaxial layer of SiGe on a silicon surface prepared according to the prior cleaning process. A hydrogen environment at about 700° C. and 50 Torr's of pressure is used.

As will be appreciated by those skilled in the art, the result of attempts to grow an epitaxial SiGe (silicon germanium) layer on a silicon layer or substrate or layer after the substrate or layer has been subjected to one or more various semiconductor processes is usually unpredictable. Unfortunately, attempts to grow an epitaxial layer after certain processes are not unpredictable in that, it is extremely difficult and unlikely to happen. For example, attempts to grow an epitaxial layer of SiGe in source/drain recesses that have been formed by an isotropic plasma etch typically fail. As an example, FIG. 1 illustrates the complete failure of epitaxial growth in recessed source/drain formed by a plasma etch wherein the silicon surface was prepared by the prior art process of removing any native oxide that may have formed by a 30 second bath of HF.

However, the present inventors have discovered that the cause of the failure of growing an epitaxial layer is a rough silicon surface on the layer or substrate. More specifically, the failure to grow an epitaxial layer is typically the result of various semiconductor manufacturing processes that have damaged the silicon surface such as, for example, plasma etching.

The formation of a native oxide layer on the surface of the silicon is also believed to negatively effect epitaxial growth. However, tests indicate that satisfactory epitaxial growth is not typically achieved even after the removal of any silicon oxide by cleaning with a hydrogen fluoride solution.

The process of the present invention, however, results in an excellent epitaxial layer being deposited on a silicon surface or substrate that has been previously subjected to harsh semiconductor fabrication processes including plasma etching. More specifically, the damaged silicon substrate surface is subjected to a hydrogen fluoride cleaning to remove any native oxide that has formed on the surface. Although various HF (hydrogen fluorides) solutions may be used, a hydrogen fluoride solution comprised of about 1% to 2% of hydrogen fluoride in water is suitable and a volume ratio solution of hydrogen fluoride to water of HF: $H_2O$=1: 50 is especially suitable. The substrate should be left in the solution for a period of between about 5 to 15 seconds and preferably about 10 seconds.

The cleaned and exposed silicon surface is then subjected to an oxidizing process that forms another or chemically formed layer of silicon oxide on the silicon surface. According to a first embodiment, the silicon oxide layer is formed by placing the silicon surface in an ozone ($O_3$) environment.

Another effective oxidation process is the RCA SC-1 (Standard Clean-1) cleaning process developed by Werner Kern. The SC-1 process uses a solution of between about 1%–30% ammonia hydroxide ($NH_4OH$), 8%–35% of hydrogen peroxide ($H_2O_2$), and between about 40%–90% deionized water. A particularly suitable volume ratio solution for oxidizing a damaged silicon layer is about $NH_4OH$: $H_2O_2$: $H_2O$=1:8:60 (1.45% of $NH_4OH$, 11.59% $H_2O_2$, and 86.96% deionized water).

Figure 2:
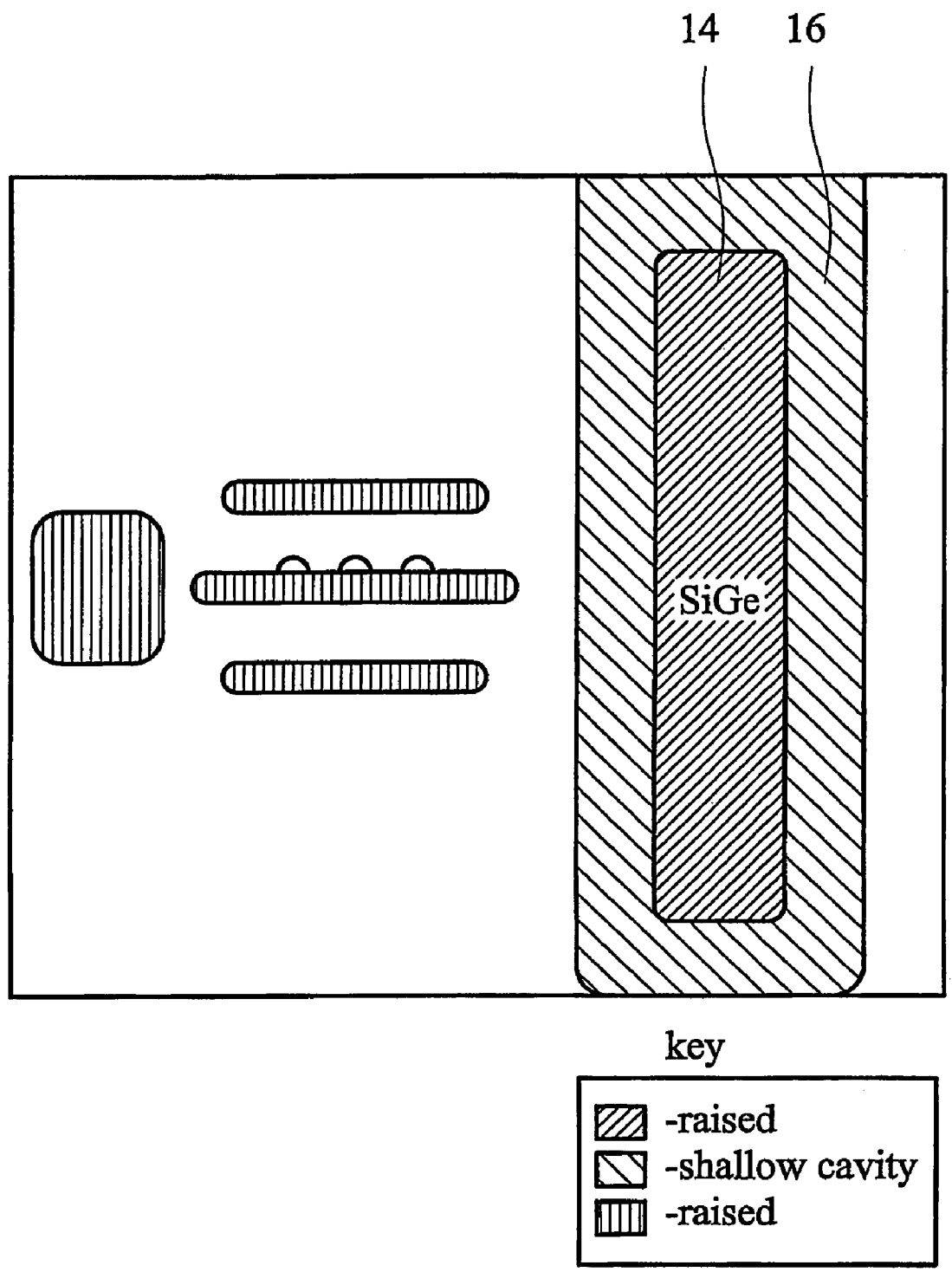
FIG. 2 is an illustration of an actual microphotograph of the results of growing a layer of SiGe in a hydrogen environment at about 700° C. and 50 Torr's of pressure according to the first embodiment of the invention comprising an oxidation step using ozone.
Figure 3:
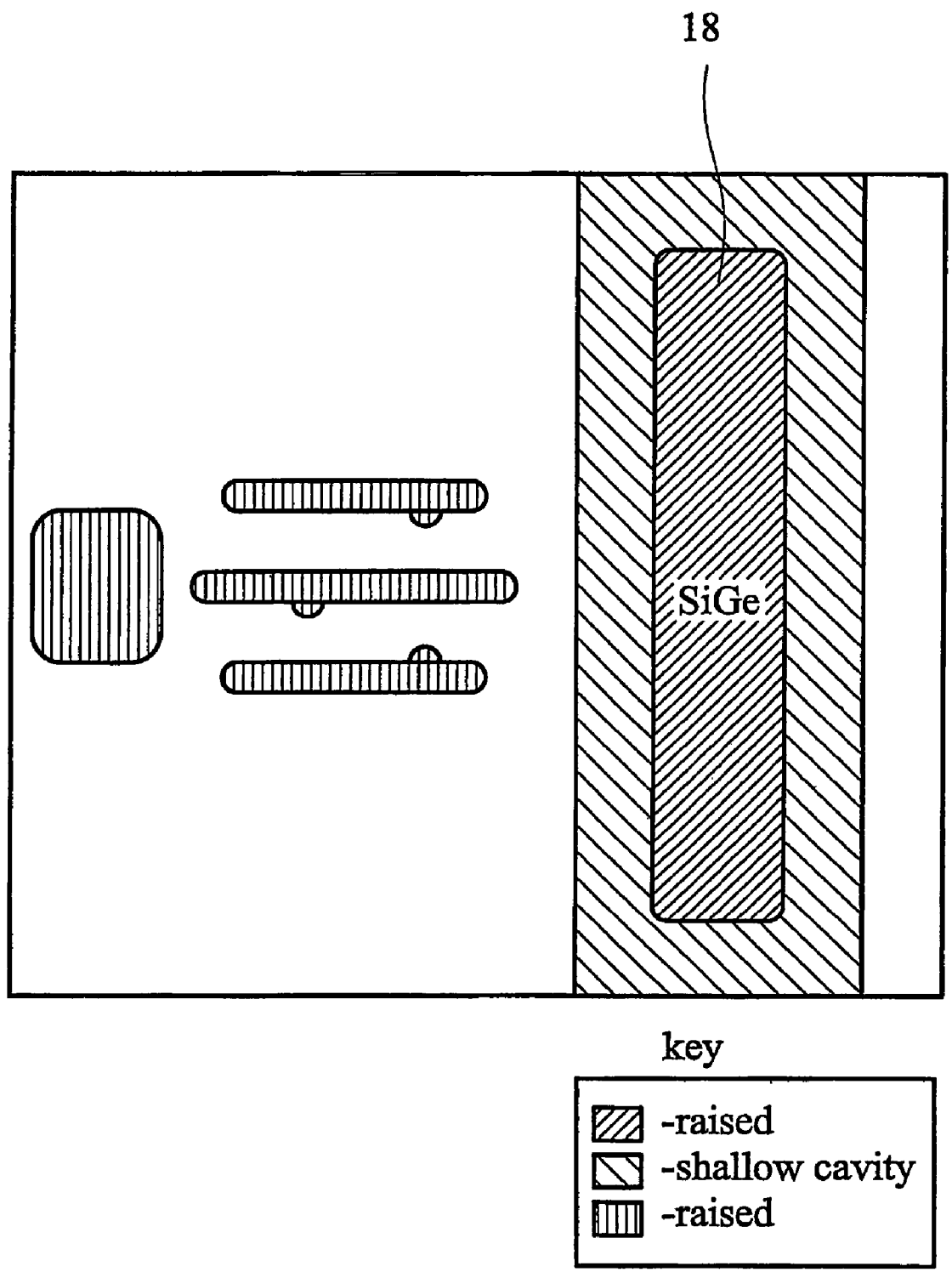
FIG. 3 is an illustration of an actual microphotograph of the results of growing a layer of SiGe in a hydrogen environment at about 700° C. and 50 Torr's of pressure according to a second embodiment of the invention comprising an oxidation step using the SC-1 cleaning process.

The chemically formed silicon oxide layer is then removed by a second cleaning process using a 1%–2% solution of Hydrogen Fluoride (HF). A particularly suitable cleaning process comprises placing the substrate in a solution of hydrogen fluoride of about 2% HF and 98% $H_2O$ for about 30 seconds. Removal of the chemically formed silicon oxide layer leaves a smooth exposed silicon surface that facilitates the growth of a high quality epitaxial layer of SiGe. FIG. 2 illustrates the successful growth of a SiGe layer 14 on a silicon surface 16 prepared according to the first embodiment of the present invention wherein the oxidation process was placing the silicon substrate in an ozone environment. FIG. 3 illustrates the successful epitaxial growth of a SiGe layer 10 where the oxidation process was the RCA SC-1 cleaning process.

The process of the invention has been successful in forming epitaxial layer on silicon having both a 100 crystaline orientation and a 110 crystaline orientation.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, means, methods and steps described in the specification. As one of ordinary skill in the art will readily appreciate from the disclosure of the present invention, processes, means, methods, or steps, presently existing or later to be developed, that perform substantially the same function or achieve substantially the same result as the corresponding embodiments described herein may be utilized according to the present invention. Accordingly, the appended claims are intended to include within their scope such processes, means, methods, or steps.

What is claimed is:

1. A method of preparing the surface of a Si substrate or layer depositing an epitaxial layer of SiGe comprising the steps of:
   providing a Si substrate;
   forming at least one S/D (source/drain) recess in said surface of said Si substrate by isotropic plasma etching, said at least one S/D/ recess having damage at the Si surface of said at least one recess caused by said isotropic plasma etching;
   subjecting said Si surface to a first cleaning with a solution of HF (hydrogen fluoride);
   oxidizing said damaged surface of said recess after said first cleaning step to form a layer of silicon oxide;
   subjecting said formed layer of silicon oxide to a second cleaning with a HF solution to remove said layer of silicon oxide to expose an undamaged Si surface of said at least one recess; and
   depositing an epitaxial layer of SiGe on said exposed undamaged Si surface of said at least one recess.

2. The method of claim 1 wherein said step of oxidation, comprises, placing said Si surface in an ozone ($O_3$) environment.

3. The method of claim 1 wherein said step of oxidizing comprises further cleaning said surface after said first cleaning with a 1:8:60 solution of ammonia hydroxide (about 1.45%), hydrogen peroxide (about 11.59%), and deionized water (about 86.96%), by volume.

4. The method of claim 1 wherein said step of oxidizing comprises further cleaning said surface often said first cleaning with the "Standard Clean-1" (SC-1) cleaning process.

5. The method of claim 1 wherein said Si surface has a crystaline 110 orientation.

6. The method of claim 1 wherein said Si surface has a crystaline 100 orientation.

7. The method of claim 1 wherein said step of depositing an epitaxial layer of SiGe comprises depositing said epitaxial layer in a hydrogen environment of about 800° C. temperature and about 50 Torrr's of pressure.

8. The method of claim 1 wherein said first cleaning step comprises subjecting said Si surface to a solution of HF having concentration of between about 1% and 2% by volume for about 10 seconds.

9. The method of claim 8 wherein said solution of hydrogen fluoride to water is about HF:$H_2O$=1:50 by volume.

10. The method of claim 1 wherein said second cleaning step comprises subjecting said Si surface to a solution of HF having concentration of between about 1% and 2% by volume for about 30 seconds.

11. The method of claim 10 wherein said solution is about 2% HF and 98% $H_2O$ by volume.

12. A method of preparing the surface of source and drain recesses of semiconductor elements formed in a silicon (Si)

substrate or layer and depositing an epitaxial layer of SiGe thereon comprising the steps of:

providing a Si substrate;

forming at least one S/D/(source/drain) recess in said surface of said Si substrate by isotropic plasma etching, said at least one S/D/recess having damage at the Si surface of said at least one recess caused by said isotropic plasma etching;

cleaning said damaged surfaces of said source and drain recess with a first cleaning process comprising a solution of HF hydrogen fluoride;

oxidizing said cleaned damaged recess surface to form a layer of silicon oxide;

removing said layer of silicon oxide by a second cleaning process comprises a solution of HF to expose an unoxidized undamaged silicon surface; and comprising the step of depositing an epitaxial layer of SiGe on said unoxidized undamaged silicon surface.

13. The method of claim 12 wherein said oxidizing step is selected from one of the processes of placing said silicon surface with said source and drain recesses in an ozone environment and further cleaning said recesses with a solution of ammonia hydroxide, hydrogen peroxide, and deionized water.

14. The method of claim 12 wherein said Si surface has a crystaline 110 orientation.

15. The method of claim 12 wherein said Si surface has a crystaline 100 orientation.

16. The method of claim 12 wherein said step of depositing said layer of SiGe comprises depositing an epitaxial layer in a hydrogen environment at about 800° C. temperature and about 50 Torr's of pressure.

17. The method of claim 12 wherein said first cleaning process comprises subjecting said Si surface to a solution of HF having concentration of between about 1% and 2% by volume for a period of about 10 seconds.

18. The method of claim 17 wherein said solution of hydrogen fluoride to water is about HF:H2O=1:50 by volume.

19. The method of claim 12 wherein said second cleaning process comprises subjecting said Si surface to a solution of HF having concentration of between about 1% and 2 by volume for a period of about 30 seconds.

20. The method of claim 19 wherein said solution is about 2% HF and 98% $H_2O$ by volume.

* * * * *

UNITED STATES PATENT AND TRADEMARK OFFICE
CERTIFICATE OF CORRECTION

| | | |
|---|---|---|
| PATENT NO. | : 7,129,184 B2 | Page 1 of 1 |
| APPLICATION NO. | : 11/001384 | |
| DATED | : October 31, 2006 | |
| INVENTOR(S) | : Chang et al. | |

It is certified that error appears in the above-identified patent and that said Letters Patent is hereby corrected as shown below:

Column 2, line 3; delete "30seconds" insert --30 seconds--
Column 4, line 52; delete "Torrr's" insert --Torr's--

Signed and Sealed this

Ninth Day of January, 2007

JON W. DUDAS
*Director of the United States Patent and Trademark Office*